United States Patent [19]

Winter

[11] 4,323,972
[45] Apr. 6, 1982

[54] OHM METER WITH AUTOMATIC LEAD RESISTANCE COMPENSATION

[75] Inventor: Robert A. Winter, Sioux Falls, S. Dak.

[73] Assignee: Sencore, Inc., Sioux Falls, S. Dak.

[21] Appl. No.: 128,914

[22] Filed: Mar. 10, 1980

[51] Int. Cl.³ .......................................... G01R 27/00
[52] U.S. Cl. .................................... 364/482; 324/62; 364/571
[58] Field of Search ............................... 364/481–487, 364/571; 324/62 R, 63, 57 R, 99 D

[56] References Cited

U.S. PATENT DOCUMENTS

| | | | |
|---|---|---|---|
| 3,978,472 | 8/1976 | Jones | 324/62 X |
| 4,091,543 | 5/1978 | Lapeyre | 364/571 X |
| 4,104,578 | 8/1978 | Thuot | 324/62 X |
| 4,150,433 | 4/1979 | Kaniel | 364/571 |
| 4,161,691 | 7/1979 | Vermeers | 324/62 X |
| 4,196,475 | 4/1980 | Hall | 364/482 |
| 4,200,933 | 4/1980 | Nickel et al. | 364/571 |
| 4,214,311 | 7/1980 | Nakashima | 364/482 |
| 4,217,651 | 8/1980 | Pickering | 324/99 D X |
| 4,228,394 | 10/1980 | Crosby | 324/62 |

Primary Examiner—Edward J. Wise
Attorney, Agent, or Firm—Edmond T. Patnaude

[57] ABSTRACT

An ohmmeter includes a memory section, which stores the resistance value of the associated leads, and a function section, which algebraically subtracts the said value from subsequent resistance measurements, so that the actual resistance of the circuit under test is displayed.

5 Claims, 4 Drawing Figures

OHM METER WITH AUTOMATIC LEAD RESISTANCE COMPENSATION

The present invention relates in general to the art of resistance measurement, and it relates more particularly to a new and improved ohmmeter which automatically eliminates the effect of lead resistance on a resistance measurement.

BACKGROUND OF THE INVENTION

An ohmmeter is an instrument which measures and displays the value of resistance connected across its input terminals, but in most cases it is either impossible or inconvenient to directly connect the element or circuit under test to these input terminals. Consequently, long flexible leads are generally used to connect the input terminals of the meter to the element or circuit whose resistance is to be measured. Since, however, the leads themselves have a significant resistance value, unless compensation for the lead resistance is made, the resistance value displayed by the meter will be erroneous, i.e., it will be the sum of the lead resistance and the resistance intended to measured.

In order to eliminate the resistance of the leads from the measurement being made, the common practice has been to provide the ohmmeter with means for adjusting the resistance value being displayed. In practice, the technician, while holding the two leads in mutual contact so that the lead resistance is connected across the input terminals, adjusts the meter to display a value of zero. Thereafter, the resistance of the leads will be automatically subtracted from subsequent measurements. This prior art method of compensating for lead resistance has two principal disadvantages. One such disadvantage arises from the fact that the zero adjustment must be repeated each time the resolution or range of the meter is changed. Consequently, that method of compensating for lead resistance cannot be used with meters having automatic ranging. The other principal disadvantage is that the adjustment is time consuming, and errors of adjustment easily occur.

SUMMARY OF THE INVENTION

Briefly, in accordance with the present invention there is provided a new and improved method and instrument for measuring resistance and for displaying the value thereof. An ohmmeter embodying the invention includes a microprocessor in the form of an integrated circuit chip which stores in internal memory the resistance value of the leads and automatically subtracts that value from the resistance value appearing between the input terminals of the meter. The meter also includes a push-button actuated switch which may be used to enter a new value of resistance into the internal memory of the microprocessor when, for example, the leads are changed. This method of lead resistance compensation eliminates the need for the technician to make adjustments, and it automatically functions for all different resolutions or range scales used. This method is substantially easier and faster to use than is the prior art zero adjustment method, and it lessens the chance of error due to misadjustment or failure to readjust the zero reading when a scale change is made. Moreover, the invention is particularly suited for use with digital display types of meters.

GENERAL DESCRIPTION OF THE DRAWINGS

The present invention will be better understood by a reading of the following detailed description taken in connection with the accompanying drawings wherein.

DETAILED DESCRIPTION OF THE INVENTION

Figure 1:
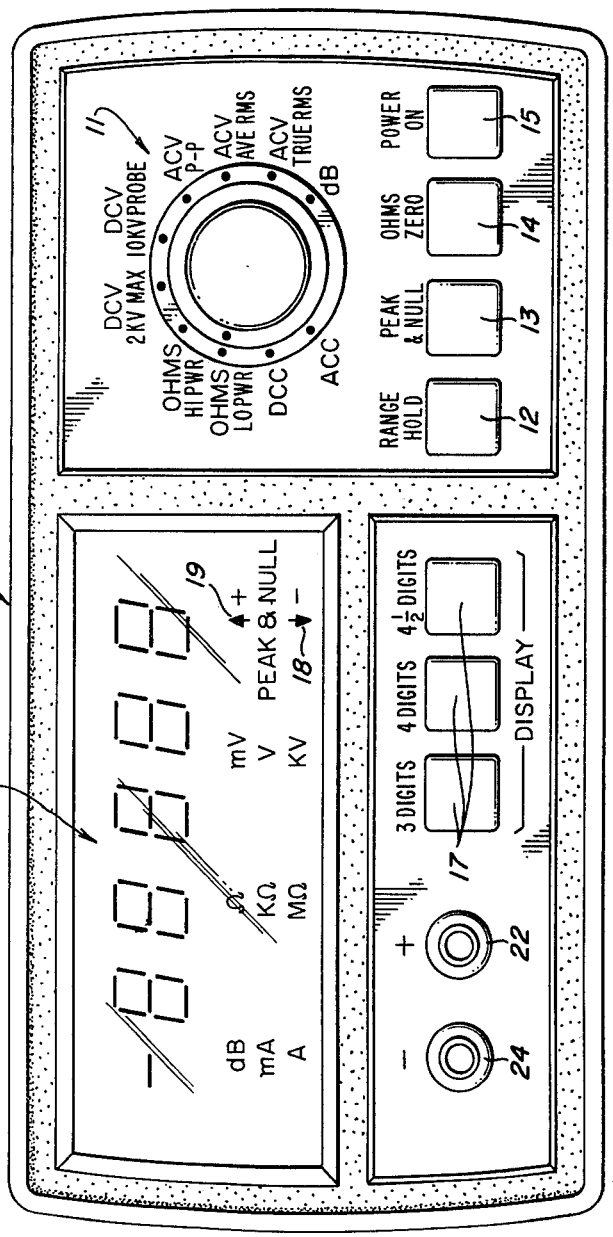
FIG. 1 is an elevational view of the face of a digital display multimeter embodying certain aspects of the present invention.

Referring now to FIG. 1, there is shown the front panel or a multimeter 10 embodying the present invention. The multimeter 10 may be used as a voltmeter, as an ammeter or as an ohmmeter. It includes a control section at the right having a conventional rotary selector 11 for selecting the operating mode of the instrument. The multimeter 10 further includes a plurality of push buttons 12, 13, 14 and 15 for actuating respectively associated switches for further controlling the operation of the instrument. A decimal display 16 is provided at the upper left of the panel, and the number of digits displayed thereby is controlled by a plurality of switch actuating push buttons 17. A pair of visual indicators in the form of LEDs 18 and 19 (light emitting diodes) are respectively activated when a voltage applied across a pair of input terminals or jacks 22 and 24 is increasing or decreasing. The variable resolution display is controlled by the push buttons 17 and is described in detail in copending application Ser. No. 89,879 filed Oct. 31, 1979. The peak-null indicating circuit which includes the LEDs 18 and 19 and the push button 13 is described in detail in copending application serial number.

The present invention is particularly related to the operation of the instrument 10 as an ohmmeter when the selector 11 is in either of the two OHMS positions. When operating in either of the ohmmeter modes, the resistance provided between the two input terminals 22 and 24 is displayed in digital form by the display 16. When using the instrument as an ohmmeter, the POWER ON button 15 is pushed in to energize the instrument, the selector 11 is rotated to one of the OHMS positions, and the leads are connected to the input terminal jacks 22 and 24. The distal ends of the leads are then held together and the ohms zero button 14 is pushed and released. The instrument is then ready for use as a conventional ohmmeter. Unlike the meters of the prior art, however, no zero adjustment is required, and the actual value of resistance connected between the outer ends of the leads will be displayed at 16. The instrument also incorporates the well known auto-ranging feature whereby the range or scale of the instrument is automatically selected to provide the most precise reading possible in keeping with the resolution selected by the operator via switches 17.

Figure 2:
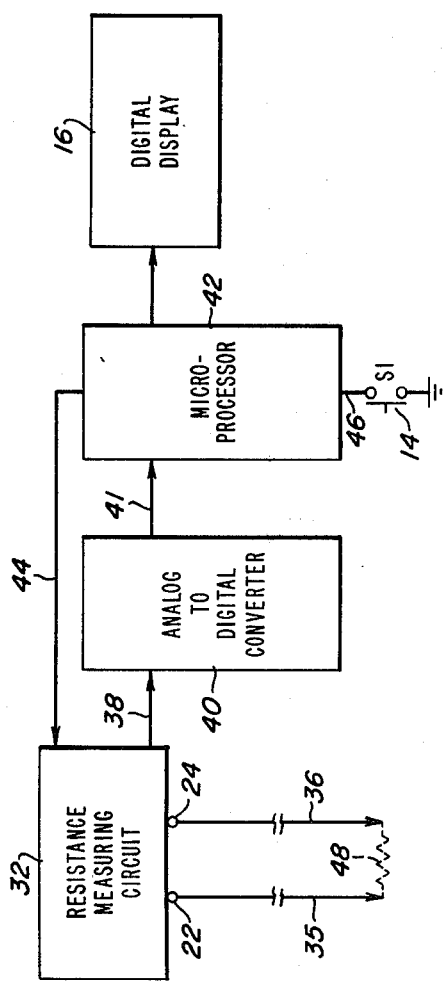
FIG. 2 is a block diagram of the ohmmeter section of the multimeter shown in FIG. 1.

Referring to FIG. 2 wherein the ohmmeter section of the instrument 10 is shown in block diagram form it may be seen that a resistance measuring circuit 32 has a pair of test input terminals 22 and 24 to which a pair of leads 35 and 36 are adapted to be connected. The circuit 32 has its output connected by a line 38 to an analog-todigital converter 40 whose digital output is coupled by a cable 41 to a microprocessor 42. The output appearing on line 38 is a voltage having a value proportional to the resistance between the test input terminals 22 and 24.

The circuit 32, as more fully described hereinafter, incorporates auto-ranging means which is controlled by the microprocessor 42. The auto-ranging control signals are carried by a plurality of conductors 44 from the microprocessor to the circuit 32 and function to step up the range by a factor of ten when the value to be displayed exceeds the range of the meter then in use. For example, if the range in use is from one to 10 ohms, and the resistance under test has a value exceeding 10 ohms, the next higher range, say 10 ohms to 100 ohms will be selected. If the value to be displayed exceeds 100 ohms, the next higher range will be selected and so on until the value under test falls within the selected range.

The microprocessor 42 energizes the proper segments of the display 16 to display the resistance value appearing between the input terminals 22 and 24 minus the resistance value stored in the programmable internal memory, RAM, of the microprocessor. A resistance value may be stored in the internal memory of the microprocessor by pushing the OHMS ZERO push button 14 to close a switch S1. As shown, closing of the switch S1 connects an input 46 of the microprocessor 42 to ground. When the input 46 is grounded the resistance value being coupled to the microprocessor is stored in internal memory (RAM) and the display 16 is deactivated. It may be seen, therefore, that the resistance of the leads 35 and 36 may be stored in the RAM of the microprocessor by touching the probes at the ends of the leads together while pushing the push button 14. Thereafter, with the push button released and the switch S1 open, the value of resistance 48 connected across the leads 35 and 36 will be accurately displayed irrespective of the range in which the circuit 32 is operating.

Figure 3:
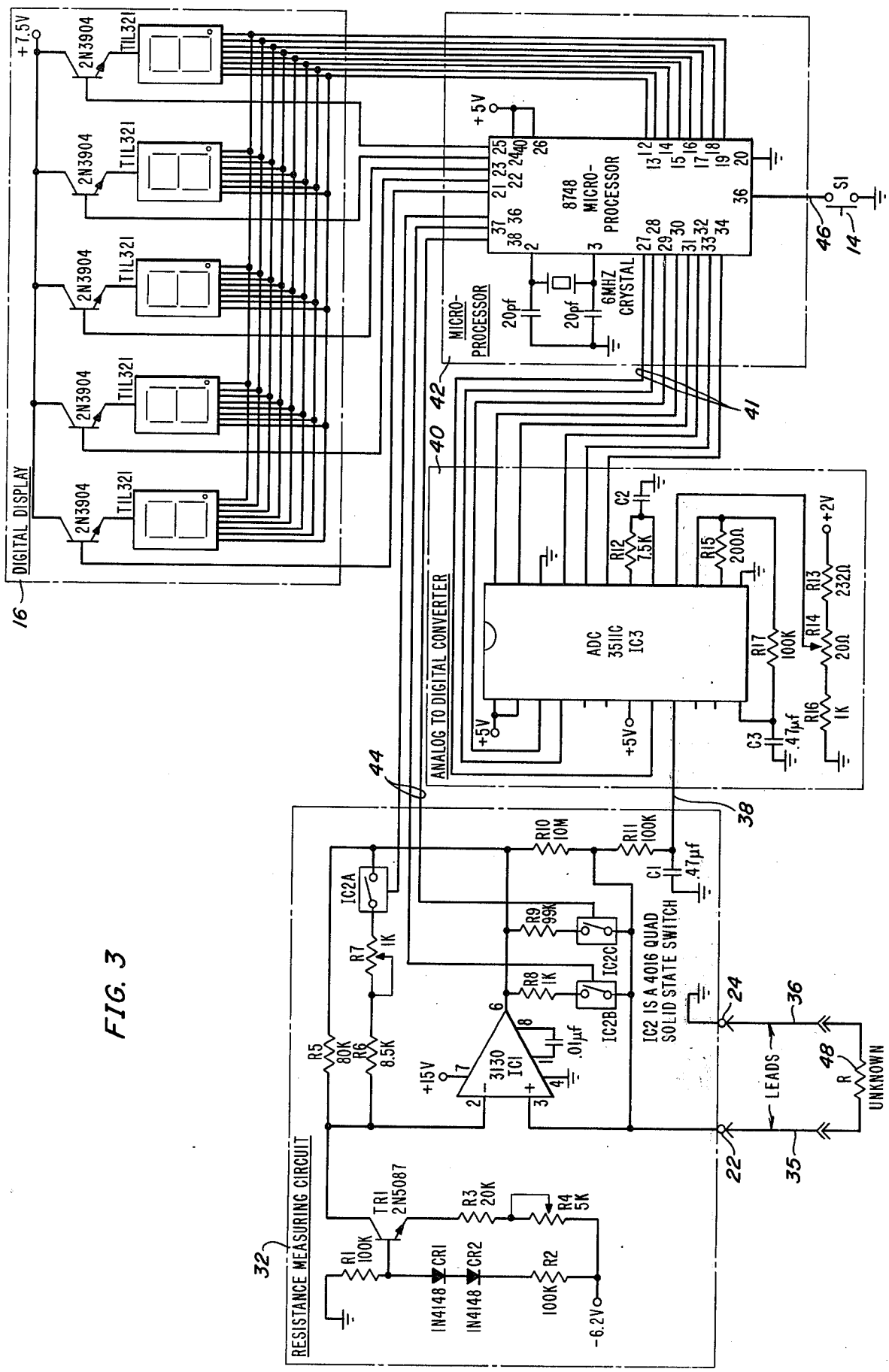
FIG. 3 is a schematic circuit diagram of the ohmmeter section of the multimeter shown in FIG. 1.

Referring to FIG. 3, there is shown a schematic circuit diagram of the ohmmeter, control and display sections of the instrument 10, which sections constitute a preferred embodiment of the present invention. The resistance measuring circuit 32 produces a known current of predetermined value between the test input terminals 22 and 24 whereby the resistance across these terminals can be calculated by Ohm's Law and is a known function of the voltage on line 38.

The current source includes a transistor TR1, a pair of diodes CR1 and CR2 and a plurality of resistors R1, R2, R3 and R4, the latter resistor being variable for use in calibrating the instrument. With the parameters illustrated in FIG. 3, this current source draws a current of 125 $\mu$A from terminal 2 of an operational amplifier IC1. The output of the amplifier IC1 appears at its terminal 6 which is connected by a resistor R5 to its input terminal 2. Also, a resistor R6, a variable resistor R7 and a solid state switch IC2A are connected in series between the terminals 2 and 6 of the operational amplifier IC1. With the switch IC2A open the 125 $\mu$A current which flows from terminal 6 to terminal 2 develops a voltage of 10 volts across the resistor R5 wherefor the voltage at terminal 6 is 10 volts higher than the voltage at terminal 2. If, however, the switch IC2A is closed, the voltage at terminal 6 is 1 volt higher than the voltage at terminal 2, a change of ten to one. Moreover with the switch IC2 in either of its two switch conditions, the voltages at terminals 2 and 3 of the operational amplifier IC1 will be approximately equal. It may thus be seen that with switch IC2A open, a voltage of ten volts is developed across a resistor R10 connected between the terminals 3 and 6 of the operational amplifier IC1, and a voltage of one volt is developed across the resistor R10 when the switch IC2A is closed. Since the current flowing through the resistor R10 is drawn from the resistor 48 under test, it has a known value of 0.1 $\mu$A when switch IC2A is closed irrespective of the value of the resistor 48.

In order to increase the overall range of the instrument, a solid state switch IC2B is connected in series with a resistor R8 across the resistor 10 and another solid state switch IC2C is connected in series with a resistor R9 across the resistor R10. With the switch IC2A closed, closing of the switch IC2C will cause a current of 10 $\mu$A to be drawn through the resistor 48 under test and closing of the switch IC2C with the switch IC2A open will cause a current of 100 $\mu$A to be drawn through the resistor 48. When both of the switches IC2A and IC2B are closed, the current drawn through the resistor 48 is 1 MA, and when the switch IC2A is open and the switch IC2B is closed the current drawn through the resistor 48 is 10 MA.

The voltage developed across the resistor 48 under test is coupled by a resistor R11 and a capacitor C1 to the analog-to-digital converter 40 which has light numerical outputs connected via the cable 41 to the corresponding inputs of the microprocessor 42. These outputs could directly drive the segments in a digital display. However, as described above, in the instrument of the present invention the number displayed is not the value of resistance appearing across the input terminals 22 and 24 but is a lesser value.

The microprocessor 42 includes a conventional 8748 microcomputer manufactured and sold by Signetics Corporation of Sunnydale, Calif. Voltages are provided at its pins 36, 37 and 38 to control the switches IC2A, IC2B and IC2C to provide auto-ranging, i.e. automatic range selection. Initially, pin 36 is high and pins 37 and 38 are low whereby the switch IC2A is closed and the switches IC2B and IC2C are open. If the number to be displayed is below the range of the display, pin 36 will also go low to open the switch IC2A. If the number to be displayed is still too low, then pins 36 and 38 will go high and pin 37 will go low. This process continues until the scale matches the number to be displayed.

As explained above, when switch S1 is closed, pin 36 goes low and the numerical data on pins 27–34 is stored in the RAM section of the microprocessor. With switch S1 open, the microprocessor subtracts the number in memory from the number on the pins 27–34 and the resulting number is represented by the data on pins 12–19. These latter pins are connected in the conventional manner to the segment busses of the display 16. Pins 21–25 of the microprocessor sequentially activate the display devices TIL-321 in the display 16 thereby to provide a visible digital display of the number corresponding to the voltages on the segment busses. The display itself is conventional.

Figure 4:
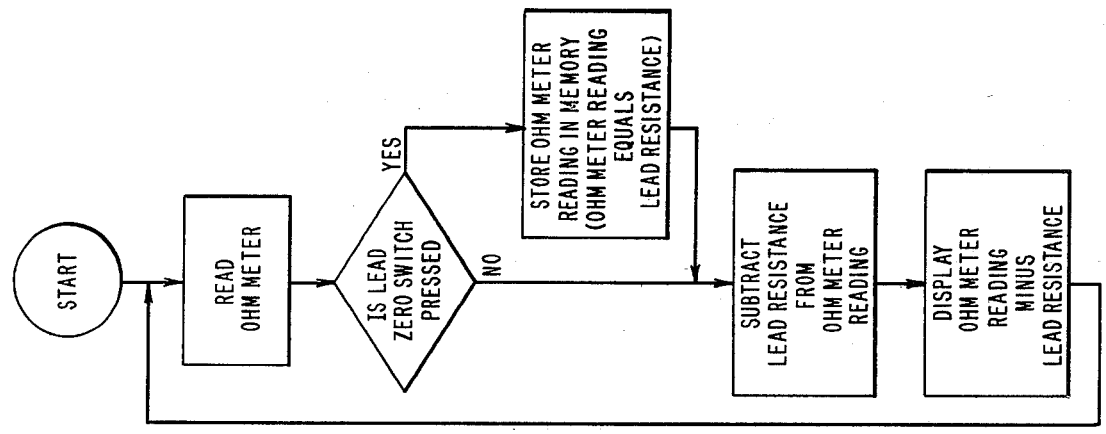
FIG. 4 is a flow diagram showing the manner in which a microprocessor in the circuit of FIG. 3 is programmed.

FIG. 4 is a simple flow chart for use in programming the microprocessor 42.

The present invention thus provides an ohmmeter which is simple to operate and when once set provides automatic compensation for the lead resistance irrespective of scale changes. In the preferred embodiment described above the invention finds use with an auto-ranging meter. The parameters shown in FIG. 3 provide an ohmmeter which has been found to function satisfactorily. It will be understood, however, that the invention is not limited to the particular circuit shown in the drawing nor to the particular circuit values. Many changes and modifications of that circuit may be made without departing from the true spirit and scope of the invention, wherefor it is intended by the appended claims to cover all such changes and modifications which come within the true spirit and scope of the invention.

What is claimed:

1. An instrument for measuring resistance, comprising
    a first input and a second input,
    metering means connected to said inputs for providing an electric output signal representative of the resistance between said inputs,
    microprocessor means to which said output signal is connected,
    switch means connected to said microprocessor means,
    said microprocessor means including data memory for storing a signal representative of the resistance value connected between said first and second inputs while said switch means is in a first switching mode,
    display means for displaying a numerical value represented by an electric input signal applied thereto, and
    said microprocessor means supplying to said display means said electric input signal when said switch means is in a second switch mode, said electric input signal representing the resistance value between said first and second inputs while said switch means is in said second switching mode minus the resistance value between said first and second inputs when said switch means was last in said f switch mode, said electric input signal representing the resistance value between said first and second inputs while said switch means is in said second switching mode minus the resistance value between said first and second inputs when said switch means was last in said first switch mode.

2. An instrument according to claim 1 wherein said metering means comprises
    a source of current,
    means connecting said source of current to said first and second inputs to cause said current to flow through a resistance connected between said first and second inputs, and
    range control means for setting said current at a selected one of a plurality of predetermined values.

3. An instrument according to claim 2 wherein
    said microprocessor means operates said range control means to select a lesser one of said predetermined value of current when the resistance value to be displayed exceeds the resolution of said display.

4. An instrument according to claim 3 wherein said output signal is the voltage developed between said first and second inputs and
    said microprocessor means operates said range control means in response to the value of said voltage.

5. A method of measuring resistance, comprising the steps of
    metering and recording the resistance value of a pair of leads,
    then metering the combined resistance value of said pair of leads and an unknown resistance,
    subtracting the resistance value of said pair of leads from the combined resistance value of said pair of leads and said unkown resistance and displaying the resulting value.

* * * * *

UNITED STATES PATENT AND TRADEMARK OFFICE
CERTIFICATE OF CORRECTION

PATENT NO. : 4,323,972
DATED : April 6, 1982
INVENTOR(S) : Robert A. Winter

It is certified that error appears in the above—identified patent and that said Letters Patent is hereby corrected as shown below:

Claim 1, the last six lines are repeated. Claim 1 should read as follows:

1. An instrument for measuring resistance,
     comprising,
   a first input and a second input,
   metering means connected to said inputs for providing
     an electric output signal representative of the
     resistance between said inputs,
   microprocessor means to which said output signal is
     connected,
   switch means connected to said microprocessor
     means,
   said microprocessor means including data memory for storing
     a signal representative of the resistance value
     connected between said first and second inputs while
     said switch means is in a first switching mode,
   display means for displaying a numerical value represented
     by an electric input signal applied thereto, and
   said microprocessor means supplying to said display means
     said electric input signal when said switch means
     is in a second switch mode, said electric input
     signal representing the resistance value between
     said first and second inputs while said switch means
     is in said second switching mode minus the resistance
     value between said first and second inputs when said
     switch means was last in said first switch mode.

UNITED STATES PATENT AND TRADEMARK OFFICE
CERTIFICATE OF CORRECTION

PATENT NO. : 4,323,972

DATED : April 6, 1982

INVENTOR(S) : Robert A. Winter

It is certified that error appears in the above—identified patent and that said Letters Patent is hereby corrected as shown below:

Claim 3, line 4, value (first occurrence) should be -values-.

Signed and Sealed this

Twentieth Day of July 1982

[SEAL]

Attest:

GERALD J. MOSSINGHOFF

Attesting Officer

Commissioner of Patents and Trademarks